(12) United States Patent
Navubothu et al.

(10) Patent No.: US 8,581,667 B2
(45) Date of Patent: Nov. 12, 2013

(54) TUNING VOLTAGE RANGE EXTENSION CIRCUIT AND METHOD

(75) Inventors: Swarna L. Navubothu, San Diego, CA (US); Cheng Zhong, San Diego, CA (US); Nam V. Dang, San Diego, CA (US); Xiaohua Kong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 25 days.

(21) Appl. No.: 13/294,902

(22) Filed: Nov. 11, 2011

(65) Prior Publication Data

US 2013/0120071 A1    May 16, 2013

(51) Int. Cl.
*H03K 3/03* (2006.01)
*H03L 7/10* (2006.01)

(52) U.S. Cl.
USPC .................. 331/57; 331/16; 331/17; 331/34

(58) Field of Classification Search
USPC .............................. 331/57, 34, 17, 16, 177 R
See application file for complete search history.

(56) References Cited

U.S. PATENT DOCUMENTS

| | | | |
|---|---|---|---|
| 5,463,352 A | 10/1995 | Chen | |
| 5,905,412 A | 5/1999 | Rasmussen | |
| 6,396,357 B1 * | 5/2002 | Sun et al. | 331/57 |
| 6,404,295 B1 * | 6/2002 | Minami et al. | 331/57 |
| 6,657,502 B2 | 12/2003 | Bushman et al. | |
| 6,759,875 B2 | 7/2004 | Mano et al. | |
| 7,321,270 B2 | 1/2008 | Ouici | |
| 7,679,467 B2 * | 3/2010 | Hirata et al. | 331/185 |
| 7,724,092 B2 | 5/2010 | Quan et al. | |
| 7,902,929 B2 | 3/2011 | Koukab et al. | |

FOREIGN PATENT DOCUMENTS

EP    0689288 A2    12/1995

OTHER PUBLICATIONS

International Search Report and Written Opinion—PCT/US2012/064731—ISA/EPO—Feb. 22, 2013.

* cited by examiner

*Primary Examiner* — Ryan Johnson
(74) *Attorney, Agent, or Firm* — Sam Talpalatsky; Nicholas J. Pauley; Joseph Agusta (57) ABSTRACT

A circuit includes a first path including a first transistor and a first current source. The first transistor is responsive to a tuning voltage. The circuit also includes a tuning voltage range extension circuit responsive to the tuning voltage. The tuning voltage range extension circuit is configured to selectively change current supplied by the first path as the tuning voltage exceeds a capacity threshold of the first transistor.

40 Claims, 6 Drawing Sheets

TUNING VOLTAGE RANGE EXTENSION CIRCUIT AND METHOD

I. FIELD

The present disclosure is generally related to extending a tuning range of a voltage controlled oscillator.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Wireless telephones can process executable instructions, including software applications, such as a web browser application that can be used to access the Internet. As such, these wireless telephones can include significant computing capabilities. Further, many such wireless telephones include other types of devices that are incorporated therein. For example, a wireless telephone can also include a digital still camera, a digital video camera, a digital recorder, and an audio file player. Reducing a voltage supply to circuits within the wireless computing device may reduce power consumption of circuits within a wireless device and increase battery life.

However, with the reduced voltage supply, charge pumps associated with phase-locked loop (PLL) circuits in a wireless device may have less headroom, lowering a tuning range associated with a VCO. In order for a VCO with a reduced voltage supply to achieve a similar frequency range as a VCO with a higher voltage supply, a gain (Kvco) of the VCO may be increased. However, increasing the gain (Kvco) of the VCO may make the PLL circuit more susceptible to noise.

III. SUMMARY

A circuit configured to selectively change a current supplied by a first path to a voltage controlled oscillator (VCO) in response to a tuning voltage range extension circuit as a tuning voltage exceeds a capacity threshold of a first transistor within the first path is disclosed. As the tuning voltage exceeds the capacity of the first transistor, the first transistor begins to turn off. Transistors within the extension circuit remain responsive to further changes of the tuning voltage and add current to the first path to compensate for the first transistor beginning to turn off, monotonically extending a tuning range of the VCO. Accordingly, the tuning range of the VCO is linearly extended by the tuning voltage range extension circuit.

In a particular embodiment, the circuit includes a first path including a first transistor and a first current source. The first transistor is responsive to a tuning voltage. The circuit also includes a tuning voltage range extension circuit responsive to the tuning voltage. The tuning voltage range extension circuit is configured to selectively change current supplied by the first path as the tuning voltage exceeds a capacity threshold of the first transistor.

In a particular embodiment, a method includes selectively changing an output current supplied by a first path in response to a tuning voltage range extension circuit as a tuning voltage exceeds a capacity threshold of a first transistor in the first path.

In a particular embodiment, an apparatus includes means for selectively changing an output current supplied by a first path in response to a tuning voltage range extension circuit as a tuning voltage exceeds a capacity threshold of a first transistor in the first path. The apparatus further includes means for providing the output current to a voltage controlled oscillator.

One particular advantage provided by at least one of the disclosed embodiments is that as a tuning voltage increases (or decreases) and exceeds a capacity of a first transistor in a first path causing the first transistor to begin to turn off or to turn off, transistors within an extension circuit remain responsive to further increases (or decreases) of the tuning voltage to compensate for the first transistor beginning to turn off, monotonically extending a tuning range of a VCO.

Other aspects, advantages, and features of the present disclosure will become apparent after review of the entire application, including the following sections: Brief Description of the Drawings, Detailed Description, and the Claims.

V. DETAILED DESCRIPTION

Figure 1:
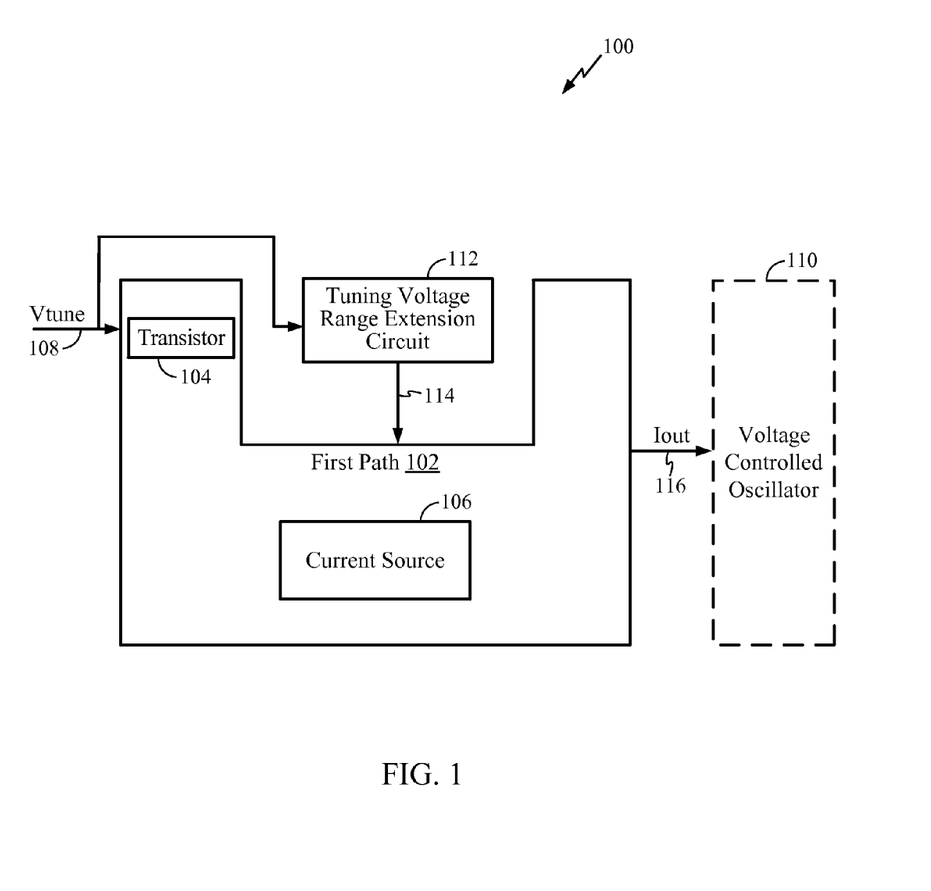
FIG. 1 is a block diagram of a particular illustrative embodiment of a circuit with a tuning voltage range extension circuit.

Referring to FIG. 1, a particular illustrative embodiment of a circuit with a tuning voltage range extension circuit is depicted and generally designated 100. The circuit 100 includes a first path 102 and a tuning voltage range extension circuit 112. The first path 102 includes a first transistor 104 and a first current source 106. The first path 102 is responsive to a tuning voltage 108 (Vtune) of a voltage controlled oscillator (VCO) 110 (shown with dashed lines). The tuning voltage range extension circuit 112 is coupled to the first path 102 and is responsive to the tuning voltage 108 (Vtune). The tuning voltage range extension circuit 112 is configured to selectively change a current 116 (Iout) supplied by the first path 102 to the VCO 110 as the tuning voltage 108 (Vtune) exceeds a capability of the first transistor 104.

For example, the tuning voltage range extension circuit 112 is configured to provide a current via connection 114 to the first path 102. As the tuning voltage 108 (Vtune) satisfies and exceeds a capacity threshold of the first transistor 104, the tuning voltage range extension circuit 112 becomes active or remains active and provides current to the first path 102 via the connection 114. The first path 102, in turn, receives the current from the tuning voltage range extension circuit 112 and provides the output current 116 (modified based on the current from the tuning voltage range extension circuit 112) to adjust operation at the voltage controlled oscillator 110 as described with respect to FIG. 2.

Thus, as the tuning voltage 108 (Vtune) exceeds a capacity of the first transistor 104 in the first path 102 causing the first transistor 104 to begin to turn off, transistors within the extension circuit 112 remain responsive to further increases (or decreases) of the tuning voltage 108 (Vtune) and provide current to the first path 102 to compensate for the first transistor 104 beginning to turn off (or gradually turning off or completely turning off), monotonically extending a tuning range of the VCO 110.

Figure 2:
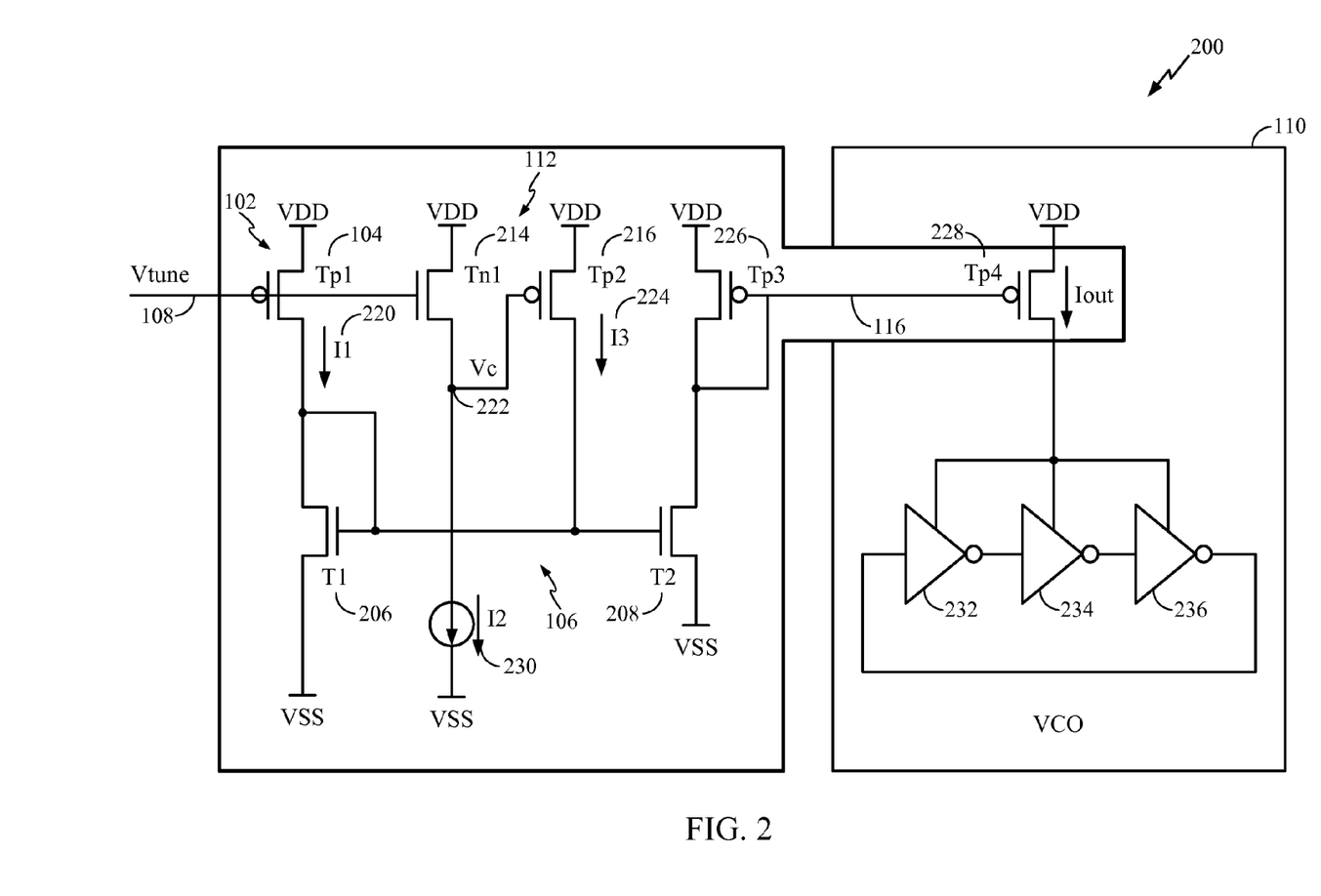
FIG. 2 is a diagram of a first particular illustrative embodiment of the circuit with the tuning voltage range extension circuit of FIG. 1.

Referring to FIG. 2, a particular illustrative embodiment of a circuit 200 is shown. The circuit 200 is an illustrative implementation of the circuit 100 of FIG. 1. The circuit 200 includes a first path, such as the first path 102 of FIG. 1, a first current source, such as the first current source 106 of FIG. 1, and a tuning voltage range extension circuit, such as the tuning voltage range extension circuit 112 of FIG. 1. The circuit 200 also receives a tuning voltage as an input, such as the tuning voltage 108 (Vtune) of FIG. 1, and has an output current, such as the output current 116 (Iout) of FIG. 1 that is provided to a voltage controlled oscillator, such as the voltage controlled oscillator (VCO) 110 of FIG. 1. The tuning voltage 108 (Vtune) is provided as an input to the first transistor 104 (Tp1) of the first path 102. The first path 102 includes the first transistor 104 (Tp1), the first current source 106, and a third transistor 226. In a particular embodiment, the third transistor 226 is a p-type metal oxide semiconductor (PMOS) transistor. The first current source 106 includes a first current mirror transistor 206 (T1) and a second current mirror transistor 208 (T2). The second current mirror transistor 208 has a current mirror relation with respect to the first current mirror transistor 206.

The tuning voltage range extension circuit 112 is responsive to the tuning voltage 108 (Vtune) and is configured to selectively change current (i.e., output current 116 (Iout)) supplied by the first path 102 as the tuning voltage 108 (Vtune) exceeds a capacity threshold of the first transistor 104 (Tp1). The tuning voltage range extension circuit 112 includes a first extension transistor 214 (Tn1) and a second extension transistor 216 (Tp2). The second extension transistor 216 (Tp2) has a terminal that provides a third current 224 (I3) to a node coupled between the first current mirror transistor 206 (T1) and the second current mirror transistor 208 (T2). Each of the first extension transistor 214 (Tn1) and the second extension transistor 216 (Tp2) is coupled to a voltage supply (Vdd). The first extension transistor 214 (Tn1) has a gate that receives the tuning voltage 108 (Vtune). The tuning voltage 108 (Vtune) is provided at a gate of the first transistor 104 (Tp1) and is provided at a gate of the first extension transistor 214 (Tn1). Thus, the gate of the first transistor 104 (Tp1) is responsive to the tuning voltage, and the gate of the first extension transistor 214 (Tn1) is also responsive to the tuning voltage 108 (Vtune).

In a particular embodiment, the first transistor 104 (Tp1) is a first PMOS transistor, the first current mirror transistor 206 (T1) is a first n-type metal oxide semiconductor (NMOS) transistor, and the second current mirror transistor 208 (T2) is a second NMOS transistor. In a particular embodiment, the first extension transistor 214 (Tn1) is an NMOS transistor and the second extension transistor 216 (Tp2) is a second PMOS transistor.

The second extension transistor 216 (Tp2) is gated by a source voltage of the first extension transistor 214 (Tn1). In particular, a voltage (Vc) at a node 222 is output by the first extension transistor 214 (Tn1), and the voltage (Vc) is received at the gate of the second extension transistor 216 (Tp2) as shown. The gate of the second extension transistor 216 (Tp2) receives a voltage level (Vc) which is at a reduced voltage as compared to the tuning voltage 108 (Vtune). In this configuration, the second extension transistor 216 (Tp2) may remain in an active mode as the first transistor 104 (Tp1) exceeds a capacity threshold and begins to turn off and begins to reduce current 220 (I1) supplied, or otherwise enters a state of providing a reduced first current 220 (I1). For example, as the tuning voltage 108 (Vtune) approaches a voltage value that is near the supply voltage (Vdd), the first transistor 104 (Tp1) exceeds a capacity threshold and may provide a reduced first current 220 (I1) and eventually may provide no first current 220 (I1) (i.e., when the first transistor 104 (Tp1) is completely off).

In a particular illustrative embodiment, the first transistor 104 (Tp1) has a capacity voltage threshold associated with a mode of operation of the first transistor 104 (Tp1). For example, the mode of operation may be a reduced current or a shut-off mode. To illustrate, the capacity threshold of the first transistor 104 (Tp1) may be a threshold voltage at which the first transistor 104 (Tp1) turns off first current 220 (I1) or at which the first transistor 104 (Tp1) begins to reduce the first current 220 (I1) supplied by the first transistor 104 (Tp1). For example, the capacity threshold of the first transistor 104 (Tp1) may be a particular threshold voltage when the first transistor 104 (Tp1) reduces the first current 220 (I1) that is output by the first transistor 104 (Tp1).

The circuit 200 further includes a voltage controlled oscillator (VCO) 110. The VCO 110 receives the current 116 (Iout) from the first path 102 responsive to the tuning voltage 108 (Vtune) and responsive to the tuning voltage range extension circuit 112. The VCO 110 may include multiple serially-coupled inverters (e.g., inverters 232, 234, 236 as shown). The circuit 200 also includes a current source 230 that provides a second current (I2). The current source 230 is coupled to the node 222 and is coupled to ground or Vss as shown. The current source 230 is also coupled to the first current path 106 as illustrated.

The circuit 200 that includes the tuning voltage range extension circuit 112 is configured to monotonically extend a tuning range associated with the VCO 110. During operation, the tuning voltage 108 (Vtune) provided to the first transistor 104 (Tp1) may vary between high and low values. When the tuning voltage 108 (Vtune) is low, the first transistor 104 (Tp1) is on and generates a first current 220 (I1), while the first extension transistor 214 (Tn1) is off, pulling the node 222 low. The second extension transistor 216 (Tp2) is responsive to the voltage (Vc) at the node 222, which generates a third or extension current 224 (I3). The sum of the first and third currents 220, 224 (I1, I3) flows through the first current mirror transistor 206 (T1) and is mirrored as current through the second current mirror transistor 208 (T2) and through the third PMOS transistor 226 (Tp3), which in turn is mirrored as the output current 116 (Tout) through a fourth PMOS transistor 228 (Tp4) in the VCO 110. The output current 116 (Iout) controls a frequency of the VCO 110.

In a particular embodiment, when the tuning voltage 108 (Vtune) is low, the first and third currents 220, 224 (I1, I3) have high values. The first current 220 (I1) flows from a drain to source of the first current mirror transistor 206 (T1) and the third current 224 (I3) flows from a drain to source of the first current mirror transistor 206 (T1). Accordingly, when the tuning voltage 108 (Vtune) is low, the first and third currents 220, 224 (I1, I3) form a large current through the first current mirror transistor 206 (T1), which is associated with a high VCO frequency.

As the tuning voltage 108 (Vtune) increases from the low value, the first current 220 (I1) decreases because the first transistor 104 (Tp1) is gated by the tuning voltage 108 (Vtune) and begins to turn off in response to the higher tuning voltage (i.e., a capacity threshold of the first transistor 104 (Tp1) has been exceeded), reducing and gradually turning off the first current 220 (I1). The third current 224 (I3) is still on after the first transistor 104 (Tp1) turns off, since the second extension transistor 216 (Tp2) is gated by the voltage (Vc) at the node 222. The voltage (Vc) at the node 222 is lower than the tuning voltage 108 (Vtune) by a voltage drop across the first extension transistor 214 (Tn1) and tracks the tuning voltage 108 (Vtune) due to the current source 230 that limits the second current (I2) through the first extension transistor 214 (Tn1). Therefore, shut off of the second extension transistor 216 (Tp2) may be "delayed," i.e., the second extension transistor 216 (Tp2) may remain active after the first transistor 104 (Tp1) has turned off.

As the tuning voltage 108 (Vtune) exceeds the capacity of the first transistor 104 (Tp1), the voltage (Vc) at the node 222 increases. Once the tuning voltage 108 (Vtune) is high enough to begin to turn off the second extension transistor 216 (Tp2), the third current 224 (I3) will begin to decrease. As a result, although the first transistor 104 (Tp1) begins to turn off in response to the higher tuning voltage 108 (Vtune), the first and second extension transistors 214, 216 (Tn1, Tp2) remain responsive to further increases of the tuning voltage 108 (Vtune), continuing to provide the third current 224 (I3) to compensate for the first transistor 104 (Tp1) beginning to turn off, thereby monotonically extending the tuning range of the VCO 110. Accordingly, the tuning range associated with the VCO 110 is linearly extended based on the tuning voltage 108 (Vtune) and the tuning voltage range extension circuit 112.

In a particular illustrative embodiment, the circuit 200 may be integrated in at least one semiconductor die. The circuit 200 may be included within an apparatus such as an electronic device. In addition, a device incorporating the circuit 200 may include a variety of different types of electronic devices. For example, the electronic devices may include a set top box, a music player, a video player, an entertainment unit, a navigation device, a communication device, a personal digital assistant (PDA), and a computer into which the tuning voltage range extension circuit 112 and the first transistor 104 (Tp1) is integrated.

Thus, the circuit 200 provides a method that selectively changes the output current 116 (Iout) supplied by the first path 102 in response to the tuning voltage range extension circuit 112 as the tuning voltage 108 (Vtune) exceeds a capacity threshold of the first transistor 104 (Tp1) in the first path 102.

Figure 3:
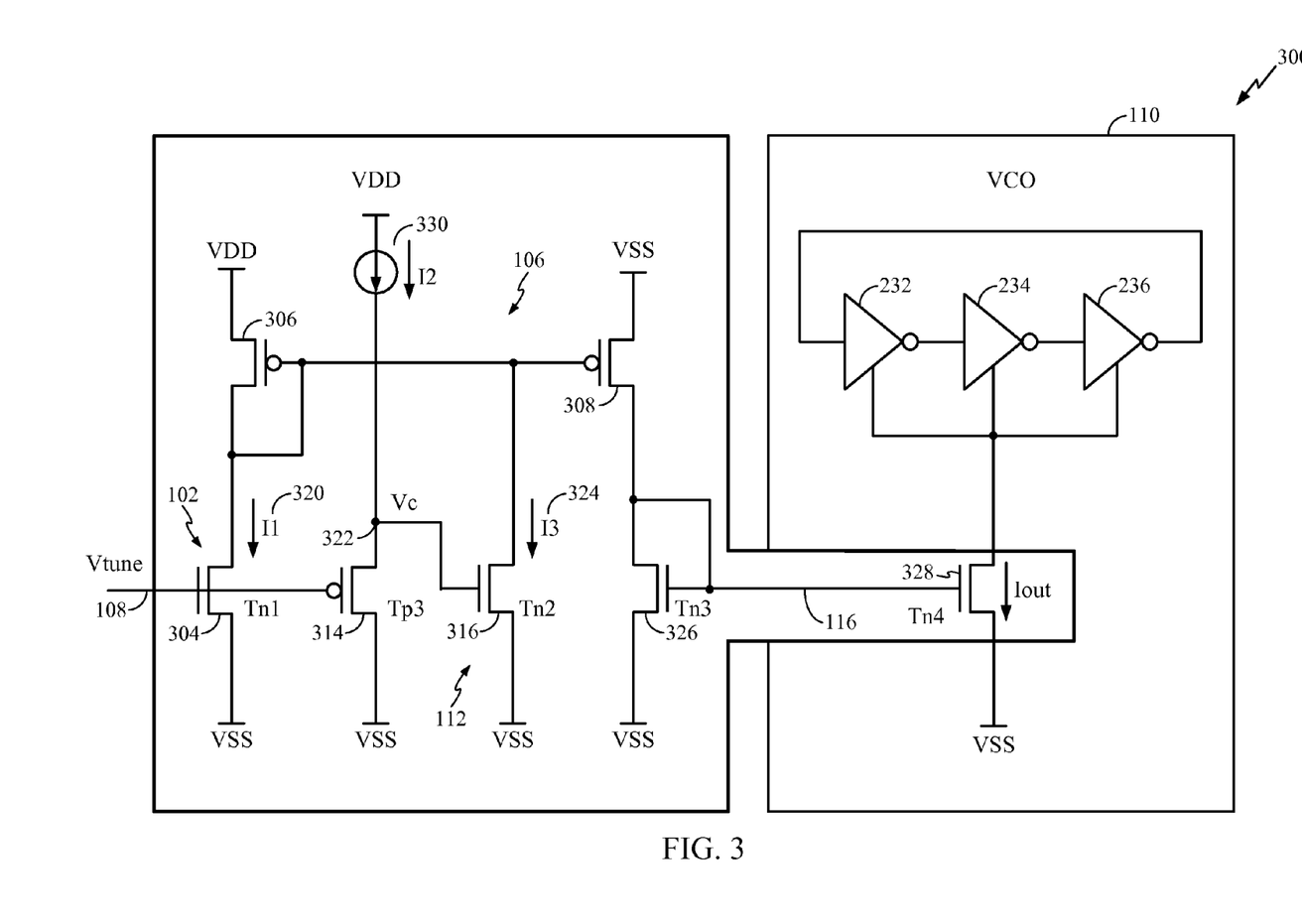
FIG. 3 is a diagram of a second particular illustrative embodiment of the circuit with the tuning voltage range extension circuit of FIG. 1.

Referring to FIG. 3, a particular illustrative embodiment of a circuit 300 is shown. The circuit 300 is another illustrative implementation of the circuit 100 of FIG. 1. The circuit 300 includes a first path, such as the first path 102 of FIG. 1, a first current source, such as the first current source 106 of FIG. 1, and a tuning voltage range extension circuit, such as the tuning voltage range extension circuit 112 of FIG. 1. The circuit 300 also receives a tuning voltage as an input, such as the tuning voltage 108 (Vtune) of FIG. 1, and has an output current, such as the output current 116 (Iout) of FIG. 1, that is provided to a voltage controlled oscillator, such as the voltage controlled oscillator (VCO) 110. The circuit 300 includes many transistors that are complementary type transistors to those described with reference to FIG. 2. For example, many of the n-type metal oxide semiconductor (NMOS) transistors of the circuit 200 of FIG. 2 have been replaced by p-type metal oxide semiconductor (PMOS) transistors in the circuit 300 of FIG. 3. Similarly, many of the PMOS transistors of the circuit 200 of FIG. 2 have been replaced by NMOS transistors of the circuit 300 of FIG. 3.

The first path 102 includes a first transistor 304 (Tn1) and the first current source 106. The first current source 106 includes a first current mirror transistor 306 and a second current mirror transistor 308. The first path 102 also includes a third NMOS transistor 326 (Tn3). The first current source 106 includes a current mirror formed by the first current mirror transistor 306 and the second current mirror transistor 308. In a particular embodiment, the first current mirror transistor 306 is a PMOS transistor and the second current mirror transistor 308 is a PMOS transistor. In a particular embodiment, the first transistor 304 (Tn1) is an NMOS transistor.

The tuning voltage range extension circuit 112 includes a third PMOS transistor 314 (Tp3) and a second NMOS transistor 316 (Tn2). The second NMOS transistor 316 (Tn2) is gated by a source voltage of the third PMOS transistor 314 (Tp3). For example, a voltage (Vc) at a node 322 is provided to a gate of the second NMOS transistor 316 (Tn2) as illustrated. The circuit 300 further includes a current source 330. The current source 330 is coupled to the node 322 and is coupled to Vdd as shown. The current source 330 is also coupled to the first current path 106 as illustrated.

During operation, the tuning voltage 108 (Vtune) provided to the first transistor 304 (Tn1) may vary between high and low values. When the tuning voltage 108 (Vtune) is high, the first transistor 304 (Tn1) is on and generates a first current 320 (I1), while the third PMOS transistor 314 (Tp3) is off, pulling the node 322 high. The second NMOS transistor 316 (Tn2) is responsive to the voltage (Vc) at the node 322, which generates a third or extension current 324 (I3). The sum of the first and third currents 320, 324 (I1, I3) flows through the first current mirror transistor 306 and is mirrored as current through the second current mirror transistor 308 and through the third NMOS transistor 326 (Tn3), which in turn is mirrored as the output current 116 (Tout) through a fourth NMOS transistor 328 (Tn4) in the VCO 110. The output current 116 (Iout) controls a frequency of the VCO 110.

As the tuning voltage 108 (Vtune) decreases from the high value, the first current 320 (I1) decreases because the first transistor 304 (Tn1) is gated by the tuning voltage 108 (Vtune) and begins to turn off in response to the lower tuning voltage, (i.e., a capacity threshold of the first transistor 304 (Tn1) has been reached), reducing and gradually turning off the first current 320 (I1). The third current 324 (I3) is still on after the first transistor 304 (Tn1) turns off, since the second NMOS transistor 316 (Tn2) is gated by the voltage (Vc) at the node 322. The voltage (Vc) at the node 322 is higher than the tuning voltage 108 (Vtune) by a threshold voltage across the third PMOS transistor 314 (Tp3) and tracks the tuning voltage 108 (Vtune) due to the current source 330 that limits the second current (I2) through the third PMOS transistor 314 (Tp3). Therefore, shut off of the second NMOS transistor 316 (Tn2) may be "delayed," i.e., the second NMOS transistor 316 (Tn2) may remain active after the first transistor 104 (Tn1) has turned off.

As the tuning voltage 108 (Vtune) exceeds the capacity (i.e., decreases) of the first transistor 304 (Tn1), the voltage (Vc) at the node 322 decreases. Once the tuning voltage 108 (Vtune) is low enough to begin to turn off the second NMOS transistor 316 (Tn2), the third current 324 (I3) will begin to decrease. As a result, although the first transistor 304 (Tn1) begins to turn off in response to the lower tuning voltage 108 (Vtune), the third PMOS transistor 314 (Tp3) and the second NMOS transistor 314 (Tn2) remain responsive to further decreases of the tuning voltage 108 (Vtune), continuing to provide the third current 324 (I3) to compensate for the first transistor 304 (Tp1) beginning to turn off, thereby monotonically extending the tuning range of the VCO 110. Accordingly, the tuning range associated with the VCO 110 is linearly extended based on the tuning voltage 108 (Vtune) and the tuning voltage range extension circuit 112. Thus, the range of the output current 116 (Iout) continues as the tuning voltage 108 (Vtune) decreases at and below the capacity threshold of the first transistor 304 (Tn1). The output current 116 (Iout) is provided to the fourth NMOS transistor 328 (Tn4) as shown. The fourth NMOS transistor 328 is coupled to a plurality of series coupled inverters 232-236 and to the supply voltage (Vss). While the rail voltages are indicated as (Vdd) and (Vss), it should be understood that the rail voltage (Vdd) may be a positive voltage and the rail voltage (Vss) may be ground or a negative voltage.

Figure 4:
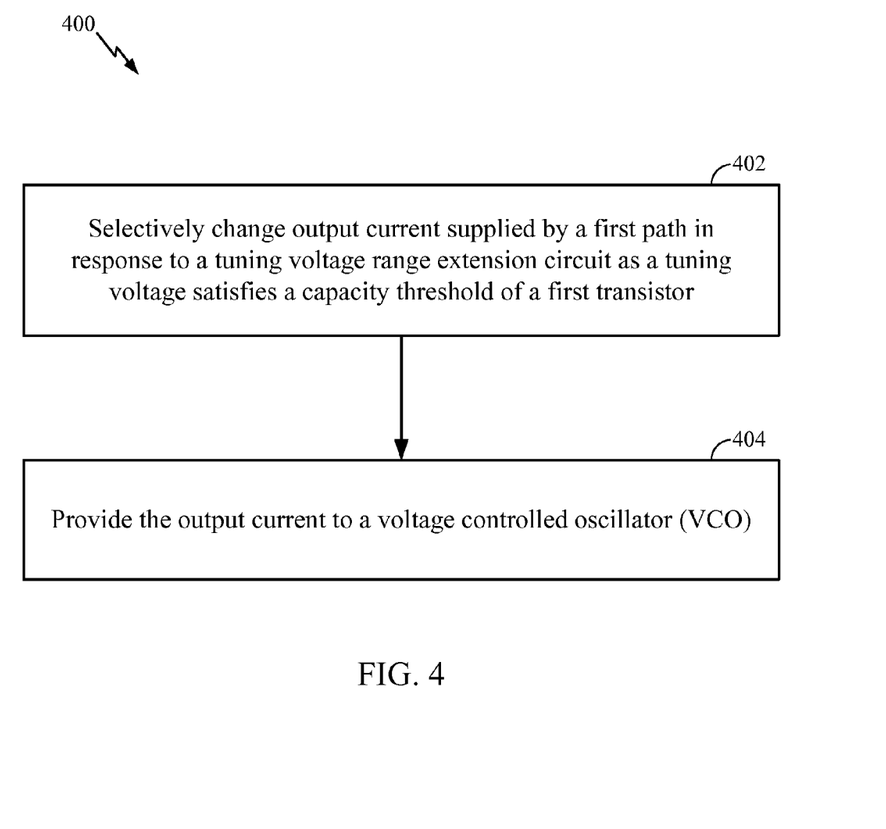
FIG. 4 is a flow chart of a particular illustrative embodiment of a method of selectively changing an output current of a circuit with a tuning voltage range extension circuit.

Referring to FIG. 4, a particular illustrative embodiment of a method 400 of operating a circuit is shown. The method 400 includes selectively changing a current supplied by a first path in response to a tuning voltage range extension circuit as a tuning voltage exceeds a capacity threshold of a first transistor, at 402. For example, the tuning voltage range extension circuit 112 is configured to provide a current via connection 114 to the first path 102 in FIG. 1. As the tuning voltage 108 (Vtune) exceeds a capacity threshold of the first transistor 104, the tuning voltage range extension circuit 112 becomes active (or remains active) and provides current to the first path 102 via the connection 114. The first path 102, in turn, receives the current from the tuning voltage range extension circuit 112 and provides the output current 116 (modified based on the current from the tuning voltage range extension circuit 112) to the voltage controlled oscillator 110. As a further example, as the tuning voltage 108 (Vtune) exceeds a capacity threshold of the first transistor 104 (Tp1) in FIG. 2, the tuning voltage range extension circuit 112 selectively changes the output current 116 (Iout) supplied by the first path 102. For example, by providing the third current 224 (I3), the second extension circuit transistor 216 (Tp2) changes the output current 116 (Iout) provided by the first path 102. As another example, as the tuning voltage 108 (Vtune) exceeds a capacity threshold of the first transistor 304 (Tn1) in FIG. 3, the tuning voltage range extension circuit 112 changes current supplied by the first path 102 (i.e., the output current 116 is changed). For example, the third current 324 (I3) provided by the second NMOS transistor 316 (Tn2) is decreased in response to the tuning voltage 108 (Vtune) exceeding the capacity threshold of the first transistor 304 (Tn1).

The method further includes providing the output current to the voltage controlled oscillator, at 404. For example, the output current 116 (Iout), changed in response to the current from the voltage tuning range extension circuit 112, is provided to the VCO 110. As another example, the output current 116 (Iout) of the circuit 200 of FIG. 2 and the circuit 300 of FIG. 3 is provided to the VCO 110.

The method of FIG. 4 may be implemented within an application-specific integrated circuit (ASIC), a field-programmable gate array (FPGA) device, a processing unit such as a central processing unit (CPU), a digital signal processor (DSP), a controller, another hardware device, firmware device, or a combination thereof.

Figure 5:
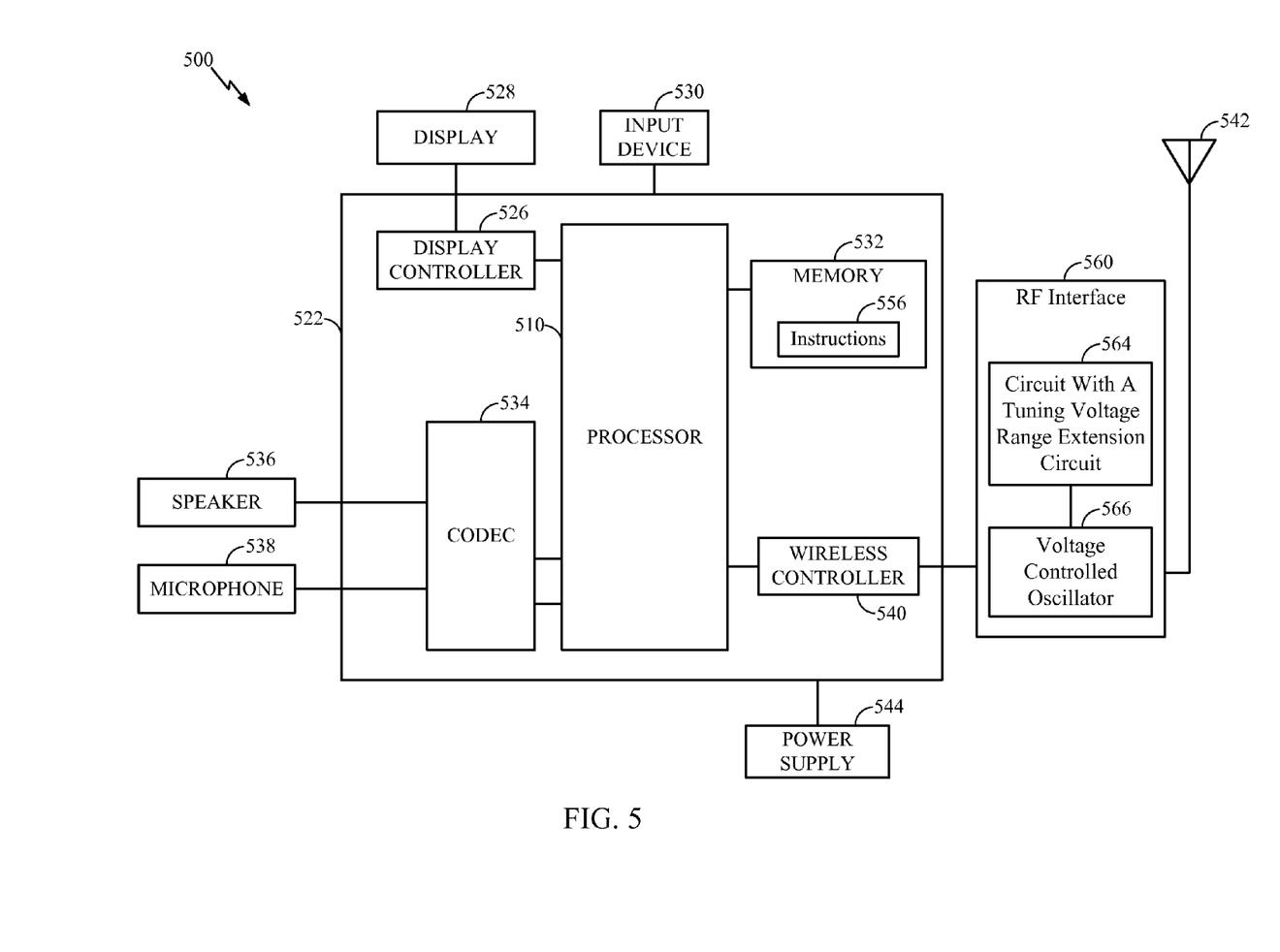
FIG. 5 is a block diagram of a wireless device including a circuit with a tuning voltage range extension circuit.

Referring to FIG. 5, a block diagram of a particular illustrative embodiment of a wireless communication device 500 having a circuit with a tuning voltage range extension circuit 564 is shown. The wireless communication device 500 may be implemented as a portable wireless electronic device that includes a radio frequency (RF) interface 560 and a processor 510, such as a digital signal processor (DSP), coupled to a memory 532.

The RF interface 560 includes the circuit with the tuning voltage range extension circuit 564 and includes a voltage controlled oscillator 566. The RF interface 560 is coupled to a wireless antenna 542. Although the RF interface 560 is illustrated as a separate device external to a system-in-package or system-on-chip device 522, in other embodiments, the RF interface 566 may be integrated with the system-in-package or system-on-chip device 522. In an illustrative embodiment, the circuit with the tuning voltage range extension circuit 564 may correspond to the circuit 100 of FIG. 1, to the circuit 200 of FIG. 2, to the circuit 300 of FIG. 3, or may operate according to the method of FIG. 4, or a combination thereof.

The memory 532 may be a non-transitory computer readable medium storing computer-executable instructions 556 that are executable by the processor 510 to cause the processor 510 to send a data signal to the circuit with tuning voltage range extension circuit 564. For example, the processor 510 may include a microprocessor of a direct digital synthesizer (DDS) device that provides a reference signal to a phase-locked loop (PLL) in the circuit 564.

FIG. 5 also shows a display controller 526 that is coupled to the digital signal processor 510 and to a display 528. A coder/decoder (CODEC) 534 can also be coupled to the digital signal processor 510. A speaker 536 and a microphone 538 can be coupled to the CODEC 534.

FIG. 5 also indicates that a wireless controller 540 can be coupled to the digital signal processor 510 and to the RF interface 560. In a particular embodiment, the DSP 510, the display controller 526, the memory 532, the CODEC 534, and the wireless controller 540 are included in the system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

While FIG. 5 illustrates a particular embodiment of a wireless device 500, one or more circuits (e.g., the circuit with the tuning voltage range extension circuit 564) may be integrated in other electronic devices including a set top box, a music player, a video player, an entertainment unit, a navigation device, a communications device, a personal digital assistant (PDA), and a computer.

In conjunction with the described embodiments, an apparatus is disclosed that may include means for selectively changing an output current supplied by a first path in response to a tuning voltage range extension circuit as a tuning voltage exceeds a capacity threshold of a first transistor in the first path. For example, as the tuning voltage 108 (Vtune) exceeds a capacity threshold of the first transistor 104 (Tp1) in the first path 102, the tuning voltage range extension circuit 112 selectively changes the output current 116 supplied by the first path 102. The means for selectively changing the output current supplied by the first path in response to the tuning voltage range extension circuit as the tuning voltage exceeds the capacity threshold of the first transistor in the first path may include the tuning voltage range extension circuit 112 from FIG. 1, the connection 114 from FIG. 1, the NMOS transistor 214 from FIG. 2, the PMOS transistor 216 from FIG. 2, the PMOS transistor 314 from FIG. 3, or the NMOS transistor 316 from FIG. 3. The apparatus may also include means for providing the output current to a voltage controlled oscillator (VCO). For example, the output current 116 (Iout), changed in response to the current from the extension circuit 112, is provided via the first path 102 to the VCO 110. The means for providing the output current to a voltage controlled oscillator (VCO) may include the PMOS transistor 226 from FIG. 2, the PMOS transistor 228 from FIG. 2, the current source 230 from FIG. 2, the NMOS transistor 326 from FIG. 3, the NMOS transistor from FIG. 3, or the current source 330 from FIG. 3. A step for providing the output current to a voltage controlled oscillator (VCO) may be performed by the PMOS transistor 226 from FIG. 2, the PMOS transistor 228 from FIG. 2, the current source 230 from FIG. 2, the NMOS transistor 326 from FIG. 3, the NMOS transistor from FIG. 3, or the current source 330 from FIG. 3.

Figure 6:
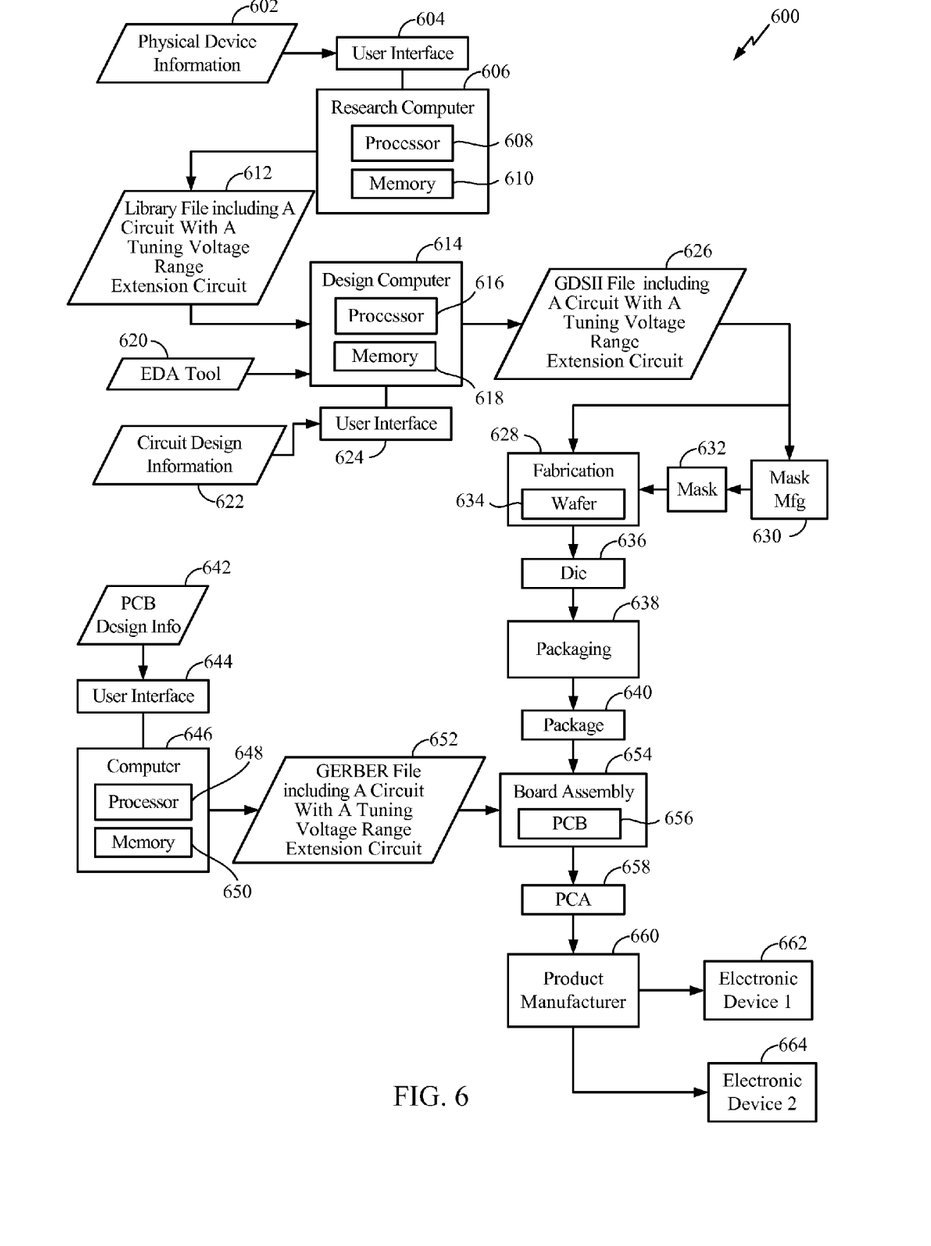
FIG. 6 is a data flow diagram of a particular illustrative embodiment of a manufacturing process to manufacture electronic devices that include a circuit with a tuning voltage range extension circuit.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in any of the electronic devices described herein. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as a device including the transistor 104 of FIG. 1, the current source 106 of FIG. 1, the tuning voltage range extension circuit 112 of FIG. 1, the first path 102 of FIG. 1, or a combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including a device that includes the transistor 104 of FIG. 1, the current source 106 of FIG. 1, the tuning voltage range extension circuit 112 of FIG. 1, the first path 102 of FIG. 1, or a combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the transistor 104 of FIG. 1, the current source 106 of FIG. 1, the tuning voltage range extension circuit 112 of FIG. 1, the first path 102 of FIG. 1, or a combination thereof, of the library file 612. For example, a user of the design computer 614 may enter circuit design information 622 via a user interface 624 coupled to the design computer 614. The circuit design information 622 may include design information representing at least one physical property of a semiconductor device, such as the transistor 104 of FIG. 1, the current source 106 of FIG. 1, the tuning voltage range extension circuit 112 of FIG. 1, the first path 102 of FIG. 1, or a combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the transistor 104 of FIG. 1, the current source 106 of FIG. 1, the tuning voltage range extension circuit 112 of FIG. 1, the first path 102 of FIG. 1, or a combination thereof, in addition to other circuits or information. To illustrate, the data file may include information corresponding to a system-on-chip (SOC) that includes the transistor 104 of FIG. 1, the current source 106 of FIG. 1, the tuning voltage range extension circuit 112 of FIG. 1, the first path 102 of FIG. 1, or a combination thereof, and that also includes additional electronic circuits and components within the SOC.

The GDSII file 626 may be received at a fabrication process 628 to manufacture the transistor 104 of FIG. 1, the current source 106 of FIG. 1, the tuning voltage range extension circuit 112 of FIG. 1, the first path 102 of FIG. 1, or a combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit including a device that includes the transistor 104 of FIG. 1, the current source 106 of FIG. 1, the tuning voltage range extension circuit 112 of FIG. 1, the first path 102 of FIG. 1, or a combination thereof.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the transistor 104 of FIG. 1, the current source 106 of FIG. 1, the tuning voltage range extension circuit 112 of FIG. 1, the first path 102 of FIG. 1, or a combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the transistor 104 of FIG. 1, the current source 106 of FIG. 1, the tuning voltage range extension circuit 112 of FIG. 1, the first path 102 of FIG. 1, or a combination thereof. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), and a computer, into which the transistor 104 of FIG. 1, the current source 106 of FIG. 1, the tuning voltage range extension circuit 112 of FIG. 1, the first path 102 of FIG. 1, or a combination thereof is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, or any other device that stores or retrieves data or computer instructions, or a combination thereof. Although FIG. 6 illustrates remote units according to teachings of the disclosure, the disclosure is not limited to these illustrated units. Embodiments of the disclosure may be suitably employed in any device which includes integrated circuitry.

A device that includes the transistor 104 of FIG. 1, the current source 106 of FIG. 1, the tuning voltage range extension circuit 112 of FIG. 1, the first path 102 of FIG. 1, or a combination thereof, may be fabricated, processed, and incorporated into an electronic device, as described in the illustrative process 600. One or more aspects of the embodiments disclosed with respect to FIGS. 1-3 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or a combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
   a first path including a first transistor and a first current source, the first transistor responsive to a tuning voltage; and
   a tuning voltage range extension circuit responsive to the tuning voltage and configured to change current supplied by the first path as the tuning voltage exceeds a capacity threshold of the first transistor, wherein the tuning voltage range extension circuit includes a second transistor gated by a source voltage of a third transistor, wherein the tuning voltage range extension circuit extends the tuning voltage range by changing the current in a single stage.

2. The circuit of claim 1, wherein the capacity threshold of the first transistor is a voltage threshold associated with a mode of operation of the first transistor.

3. The circuit of claim 2, wherein the capacity threshold of the first transistor is a threshold voltage at which the first transistor turns off or at which the first transistor begins to reduce current supplied by the first transistor.

4. The circuit of claim 3, wherein a gate of the first transistor is responsive to the tuning voltage.

5. The circuit of claim 1, wherein the first current source includes a current mirror formed by a first n-type metal oxide semiconductor (NMOS) transistor and a second NMOS transistor.

6. The circuit of claim 5, wherein the first transistor is a p-type metal-oxide semiconductor (PMOS) transistor.

7. The circuit of claim 6, wherein the second transistor is a PMOS transistor.

8. The circuit of claim 7, wherein the third transistor is an NMOS transistor.

9. The circuit of claim 1, wherein changing the current in the single stage comprises adjusting, via a drain of the third transistor, a gate bias of a current mirror that includes the first transistor.

10. The circuit of claim 1, further comprising a voltage controlled oscillator (VCO), wherein the VCO includes multiple serially-coupled inverters.

11. The circuit of claim 9, wherein the tuning voltage range extension circuit is configured to monotonically extend a tuning range associated with the VCO.

12. The circuit of claim 1, wherein the first current source includes a current mirror formed by a first p-type metal oxide semiconductor (PMOS) transistor and a second PMOS transistor.

13. The circuit of claim 12, wherein the first transistor is an n-type metal-oxide semiconductor (NMOS) transistor.

14. The circuit of claim 13, wherein the second transistor is an NMOS transistor.

15. The circuit of claim 14, wherein the third transistor is a PMOS transistor.

16. The circuit of claim 1 integrated in at least one semiconductor die.

17. The circuit of claim 1, further comprising a device selected from the group consisting of a set top box, a music player, a video player, an entertainment unit, a navigation device, a communications device, a personal digital assistant (PDA), and a computer, into which the tuning voltage range extension circuit and the first transistor are integrated.

18. A method comprising:
selectively changing an output current supplied by a first path in response to a tuning voltage range extension circuit as a tuning voltage exceeds a capacity threshold of a first transistor in the first path, wherein the tuning voltage range extension circuit includes a second transistor gated by a source voltage of a third transistor, wherein the voltage range extension circuit extends the tuning voltage range by changing the output current in a single stage.

19. The method of claim 18, wherein the first path includes a first current source that includes a current mirror.

20. The method of claim 18, wherein the capacity threshold of the first transistor is a threshold voltage at which the first transistor turns off or at which the first transistor begins to reduce current supplied by the first transistor.

21. The method of claim 18, further comprising providing the output current to a voltage controlled oscillator (VCO).

22. The method of claim 21, wherein the tuning voltage range extension circuit is configured to provide current to monotonically extend a tuning range associated with the VCO.

23. The method of claim 18, wherein changing the current in the single stage comprises adjusting, via a drain of the third transistor, a gate bias of a current mirror that includes the first transistor.

24. An apparatus comprising:
a tuning voltage range extension circuit configured to change an output current supplied by a first path as a tuning voltage exceeds a capacity threshold of a first transistor in the first path, wherein the tuning voltage range extension circuit includes a second transistor gated by a source voltage of a third transistor, wherein the tuning voltage range extension circuit extends the tuning voltage range by changing the output current in a single stage; and
means for providing the output current to a voltage controlled oscillator (VCO).

25. The apparatus of claim 24, wherein the first path includes a first current source that includes a current mirror.

26. The apparatus of claim 24, wherein the capacity threshold of the first transistor is a threshold voltage at which the first transistor turns off or at which the first transistor begins to reduce current supplied by the first transistor.

27. The method of claim 21, wherein the tuning voltage range extension circuit is configured to provide current to monotonically extend a tuning range associated with the VCO.

28. An apparatus comprising:
a circuit including:
a first path including a first transistor and a first current source, the first transistor responsive to a tuning voltage; and
a tuning voltage range extension circuit responsive to the tuning voltage and configured to selectively change current supplied by the first path as the tuning voltage exceeds a capacity threshold of the first transistor, wherein the tuning voltage range extension circuit includes a second transistor gated by a source voltage of a third transistor, wherein the tuning voltage range extension circuit extends the tuning voltage range by adjusting, via a drain of the third transistor, a gate bias of a current mirror that includes the first transistor to change the current.

29. The apparatus of claim 28, wherein the first current source includes a current mirror.

30. The apparatus of claim 28, wherein the capacity threshold of the first transistor is a threshold voltage at which the first transistor turns off or at which the first transistor begins to reduce current supplied by the first transistor.

31. The apparatus of claim 28, further comprising a voltage controlled oscillator (VCO).

32. The apparatus of claim 31, wherein the tuning voltage range extension circuit is configured to provide current to monotonically extend a tuning range associated with the VCO.

33. The apparatus of claim 28, wherein the circuit is integrated in at least one semiconductor die.

34. The apparatus of claim 28, further comprising a device selected from the group consisting of a set top box, a music player, a video player, an entertainment unit, a navigation device, a communications device, a personal digital assistant (PDA), and a computer, into which the tuning voltage range extension circuit and the first transistor is integrated.

35. A method comprising:
changing an output current supplied by a first path that includes a first transistor in response to a tuning voltage range extension circuit as the tuning voltage exceeds a capacity threshold of the first transistor, wherein the tuning voltage range extension circuit includes a second transistor gated by a source voltage of a third transistor, wherein the tuning voltage range extension circuit extends the tuning voltage range by changing the output current in a single stage, wherein the tuning voltage range extension circuit extends the tuning voltage range by adjusting, via a drain of the third transistor, a gate bias of a current mirror that includes the first transistor to change the output current; and a step for providing the output current to a voltage controlled oscillator (VCO).

36. The method of claim 35, wherein the capacity threshold of the first transistor is a threshold voltage at which the first transistor turns off or at which the first transistor begins to reduce current supplied by the first transistor.

37. The method of claim 35, wherein the tuning voltage range extension circuit is configured to monotonically extend a tuning range associated with a VCO.

38. A method comprising:
receiving a data file comprising design information corresponding to a semiconductor device; and
fabricating the semiconductor device according to the design information, wherein the semiconductor device comprises:
a first path including a first transistor and a first current source, the first transistor responsive to a tuning voltage; and
a tuning voltage range extension circuit responsive to the tuning voltage and configured to selectively change current supplied by the first path as the tuning voltage exceeds a capacity threshold of the first transistor, wherein the tuning voltage range extension circuit includes a second transistor gated by a source voltage of a third transistor, wherein the tuning voltage range extension circuit extends the tuning voltage range by changing the current in a single stage.

39. The method of claim 38, wherein the data file has a database file format.

40. The method of claim 38, wherein the data file has a vector file format.

* * * * *